United States Patent
Singerl et al.

(10) Patent No.: US 8,374,233 B2
(45) Date of Patent: Feb. 12, 2013

(54) IQ-MODULATION SYSTEM AND METHOD FOR SWITCHED AMPLIFIERS

(75) Inventors: Peter Singerl, Villach (AT); Thomas Blocher, Graz (AT); Andreas Wiesbauer, Poertschach (AT)

(73) Assignee: Intel Mobile Communications GmbH, Neubiberg (DE)

( * ) Notice: Subject to any disclaimer, the term of this patent is extended or adjusted under 35 U.S.C. 154(b) by 1016 days.

(21) Appl. No.: 12/237,893

(22) Filed: Sep. 25, 2008

(65) Prior Publication Data

US 2010/0073102 A1    Mar. 25, 2010

(51) Int. Cl.
*H03K 7/08* (2006.01)
(52) U.S. Cl. ......... 375/238; 332/108; 332/109; 330/10
(58) Field of Classification Search ............... 375/238; 330/10; 332/108, 109
See application file for complete search history.

(56) References Cited

U.S. PATENT DOCUMENTS

| | | | | |
|---|---|---|---|---|
| 7,889,787 B2* | 2/2011 | Shifrin | ............... | 375/238 |
| 7,924,200 B2* | 4/2011 | Khoury | ............... | 341/152 |
| 2004/0196899 A1* | 10/2004 | Zhou et al. | ............... | 375/238 |
| 2005/0033168 A1 | 2/2005 | Shifrin | | |
| 2009/0027118 A1* | 1/2009 | Andersen et al. | ............... | 330/10 |
| 2009/0180530 A1* | 7/2009 | Ahn | ............... | 375/238 |

FOREIGN PATENT DOCUMENTS

| | | |
|---|---|---|
| DE | 60124451 T2 | 3/2007 |
| WO | 2007079396 A2 | 7/2007 |

* cited by examiner

*Primary Examiner* — Eva Puente
(74) *Attorney, Agent, or Firm* — Eschweller & Associates, LLC

(57) ABSTRACT

An apparatus and methods for a baseband modulator configured to code amplitude signals into pulse width modulated time signals comprising at least two amplitude levels is disclosed. A pulse width modulator can receive a component signal of a baseband complex signal and generate a discrete-time pulse width modulated signal. This signal can be converted to a continuous time signal, such as a pulse-width modulated time signal and can be shifted to a carrier signal corresponding respectively to the component signal by a switch. Bursts sequences are generated to an input of a switched amplifier for driving operation of the amplifier therein.

9 Claims, 7 Drawing Sheets

IQ-MODULATION SYSTEM AND METHOD FOR SWITCHED AMPLIFIERS

FIELD OF INVENTION

The present invention relates generally to baseband modulation systems and methods for coding component signals for driving the operation of switched amplifiers.

BACKGROUND

Bandwidth-efficient modulation methods with a non-constant envelope are used in base stations of the third and higher generations. It is precisely this fluctuation that leads to the need to operate "quasi-linear" high-frequency power amplifiers with a large back-off operating point in order to meet the high linearity requirements that are usually specified by a standard. Utilizing this operating mode, however, leads to poor efficiency, which is reflected strongly in the production and operation costs of the base station.

There are a number of measures that can be used to improve efficiency under a given set of linearity requirements. This can be achieved by special HF power amplifier architectures, using improved transistor technologies, and by special linearization circuits (which can be realized both in the high-frequency range and in the digital baseband). The overall efficiency, which can be achieved by these state-of-the-art methods, however, is still only about 30%. Accordingly, there is a continued need to improve the efficiency of base station power amplifier and modulation systems.

SUMMARY

The following presents a simplified summary in order to provide a basic understanding of one or more aspects of the disclosure. This summary is not an extensive overview, and is neither intended to identify key or critical elements of the disclosure, nor to delineate the scope thereof. Rather, the primary purpose of the summary is to present some concepts in a simplified form as a prelude to the more detailed description that is presented later.

In one embodiment, a baseband modulator is configured to code a component of a complex baseband signal into a discrete-time sequence string in a baseband for a switched amplifier. The baseband modulator can comprise a digital pulse width modulator configured to receive the component of the complex baseband signal and generate a discrete-time pulse width modulated signal. The modulator further comprises a converter coupled to the digital pulse width modulator and configured to receive the discrete-time pulse width modulated signal to generate a pulse-width modulated time signal. The modulator also comprises a switch configured to shift the pulse-width modulated time signal to a carrier signal corresponding to the component and generate burst sequences to an input of the switched amplifier to drive operation of the switched amplifier.

In another embodiment, a baseband modulator is configured to code amplitudes of a component signal into continuous time sequences for a switched amplifier. The modulator comprises a plurality of modulating paths respectively corresponding to the component signal, and respectively configured to generate a modulated signal comprising at least two amplitude levels. The modulating paths respectively comprise an input configured to receive the component signal and a modulator element configured to calculate the modulated signal with a predetermined time offset. The modulator element is configured to scale corresponding signal amplitudes to limit maximum duty cycles to a predetermined percent. An output of the modulating path corresponding to the component signal is configured to receive the modulated signal and to transmit a pulse width modulated continuous time sequence to a switch. The switch is configured to switch the pulse width modulated continuous time sequence to a corresponding carrier as a function of amplitude and to generate burst sequences at an input of the switched amplifier, wherein the burst sequences from the plurality of modulating paths are combined at the input of the switched amplifier before amplification to operate the switched amplifier.

In yet another embodiment, a method for coding a respective component of a base band signal comprising an in-phase component and a quadrature component into a discrete-time sequence string in a baseband for a switched amplifier is disclosed. The method comprises receiving a component of the complex baseband signal and generating a discrete-time pulse width modulated signal from the component received. The method further comprises converting the discrete-time pulse width modulated signal to a pulse-width modulated time signal, and shifting the pulse-width modulated time signal to a carrier signal as a function of amplitude corresponding to the respective component and generating burst sequences therefrom to an input of the switched amplifier. The burst sequences corresponding to the respective component are combined at an input of the switched amplifier before amplification to operate the switched amplifier and do not substantially overlap in time with one another.

The following description and annexed drawings set forth in detail certain illustrative aspects and implementations. These are indicative of only a few of the various ways in which the disclosed principles may be employed.

DETAILED DESCRIPTION

Figure 1:
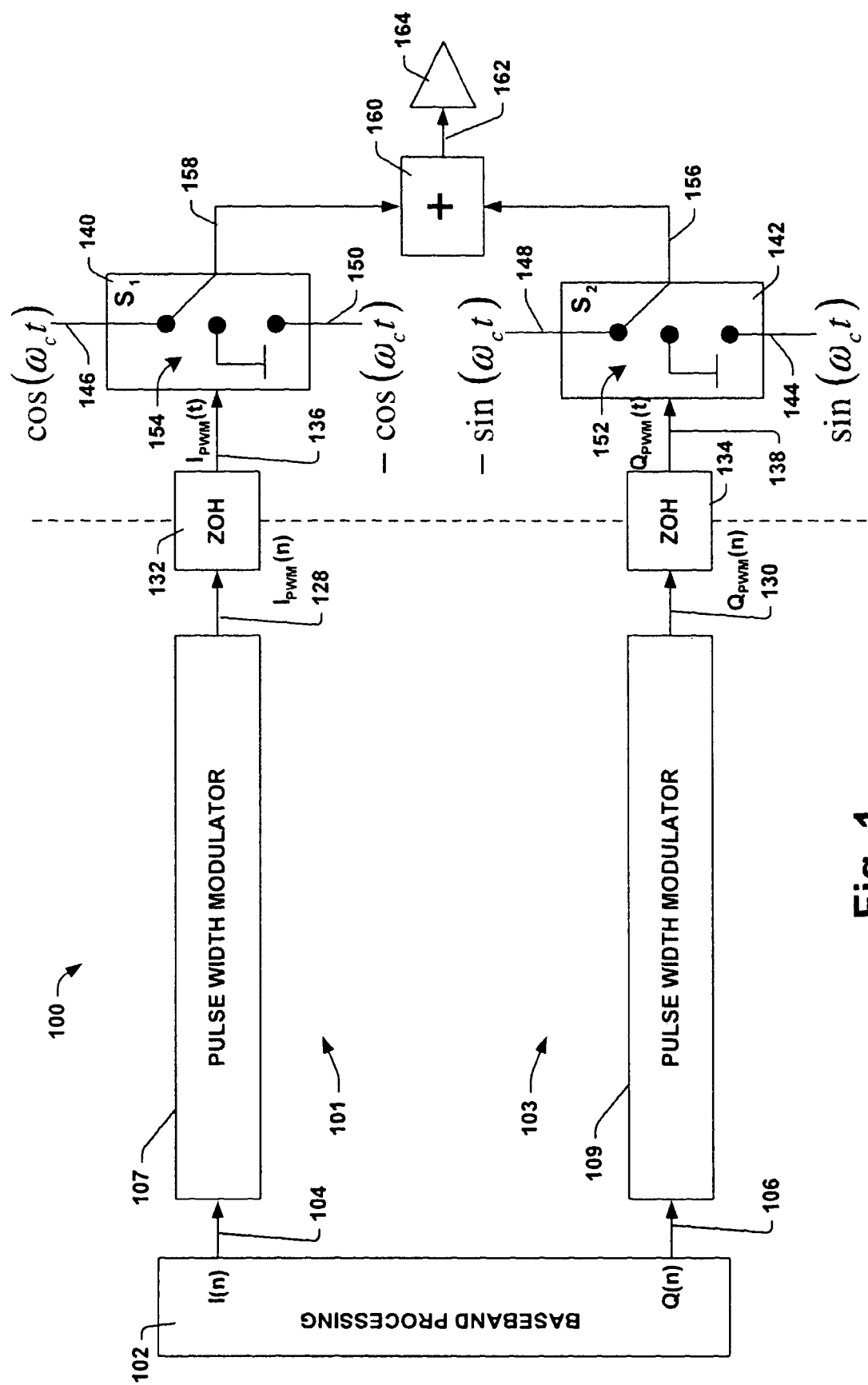
FIG. 1 is a simplified block diagram of a baseband modulator for a switched amplifier according to one embodiment.

One or more implementations will now be described with reference to the attached drawings, wherein like reference numerals are used to refer to like elements throughout. Systems and methods are disclosed for a baseband modulator which codes the corresponding components of a complex baseband signal (real and imaginary) into discrete-time ternary sequences (three different amplitude levels) which do not overlap in time and which can therefore be combined by a switched amplifier before amplification.

Because the overall efficiency achievable by conventional RF power amplification methods is still quite low (e.g., about 30%), there is a continued need to improve the efficiency of base station RF power amplifier and modulation systems. This efficiency can be significantly improved (e.g., to approximately 60%) according to one embodiment by using switched amplifiers such as class F, inverse class F, class D, etc., instead of the "quasi-linear" (e.g., AB mode) high-frequency power amplifiers. Because current and voltage generally do not occur simultaneously in ideal switches, much higher efficiencies can thus be obtained. When these types of switched amplifiers are used for applications with bandwidth-efficient modulation methods (e.g., UMTS base stations), special circuits (modulators) are disclosed which code both the time-dependent phase and the time-dependent envelope (amplitude) of the carrier frequency in the time domain to drive these switched amplifiers, so that the original high-frequency transmission signal can be recovered by the simplest possible demodulation means, for example, by using bandpass filters (BPF).

In accordance with the disclosure, a baseband modulation method is provided in one embodiment which codes corresponding components of a complex baseband signal (real and imaginary) into discrete-time ternary sequences (three different amplitude levels), which do not overlap in time and can be combined by a switched amplifier before amplification. Advantages over previous power amplifier implementations are thereby provided including high efficiency, power and cost savings.

Turning now to FIG. 1, is a simplified schematic diagram of a baseband modulator system 100 as one embodiment of the disclosure. The modulator system 100 can code amplitudes of a component signal 104 into a modulated signal 128 comprising at least two amplitude levels wherein the information of the amplitudes can be generated in the timing of the modulated signal. The modulated signal 128 can be converted into a continuous signal 136 configured to operate a switched power amplifier 164.

For example, the baseband modulator system 100 can code amplitudes of corresponding components (e.g., I and Q) of a complex baseband signal as one embodiment of the disclosure. The modulator system 100 can comprise a baseband processing circuit 102 that is configured to derive an in-phase (I) component 104 and a quadrature (Q) component 106 of a baseband signal for transmission along signal pathways 101 and 103 respectively. Pathways 101, 103 respectively comprise a pulse width modulator 107, 109 configured to receive the component 104,106 of the complex baseband signal and respectively generate a pulse width modulated (PWM) signal ($I_{pwm}$, $Q_{pwm}$) 128, 130 comprising at least two amplitude levels, such as a discrete PWM signal.

In one embodiment, the modulator system 100 further comprises a converter 132, 134 along respective pathways 107, 109 for converting the discrete-time pulse width modulated signal it receives from a digital signal ($I_{pwm}(n)$, $Q_{pwm}(n)$) 128, 130 into a continuous time (e.g., analog) signal, which can be a pulse-width modulated time signal ($I_{pwm}(t)$, $Q_{pwm}(t)$) 136, 138. For example, the converter 132 can be a zero-order-hold device and/or any other component configured to function for converting a discrete-time signal to a continuous-time signal by holding each sample value for a sample interval. The converters 132, 134 can be configured to respectively receive the discrete-time pulse width modulated signals 128, 130 and to respectively generate the pulse-width modulated time signal 136, 138.

In one embodiment, the pathways 101 and 103 can respectively comprise a switch ($S_1$) 140, ($S_2$) 142. The switches 140 and 142 along respective pathways 101, 103 can operate as a function of the pulse-width modulated time signal 136, 138 received there at an input. The switches 140 and 142 can be configured to operate as a function of amplitude, for example, and can comprise various locations of position. For example, switch 140 along the path 101 can be positioned in one of three positions 146, 150, 154. FIG. 1 illustrates an example of a position 146 of the switch 140, although the switch can be configured to transition to other positions as a function of the pulse-width modulated time signals. In this embodiment, the pulse-width modulated time signal $I_{pwm}$, 136 transmits to the switch 140 and can be combined (e.g., multiplied) with an orthogonal carrier at position 146 (e.g., $\cos(\omega_c t)$), 150 (e.g., $-\cos(\omega_c t)$), or grounded at position 154, for example. Similarly, the pulse-width modulated time signal $Q_{pwm}$, 138 can transmit to the switch 142 and combined with an orthogonal carrier at position 144 (e.g., $\sin(\omega_c t)$), 148 (e.g., $-\sin(\omega_c t)$), or grounded at position 152, for example.

In one embodiment, the pulse-width modulated time signals 136, 138 can be shifted in a frequency range to an RF carrier in order to generate RF bursts 158, 156 along respective pathways 101, 103. Because the pulse-width modulated time signals 136, 138 may be in a baseband position, the switches 140, 144 can be configured to shift each signal in a frequency range. In one embodiment, the pulse-width modulated time signals are shifted in a frequency range by multiplying the real part and imaginary part of the each baseband signal by orthogonal RF carriers (cos, sin) respectively. The results can then be combined (e.g., added) and operable for driving the switched amplifier 164.

The RF bursts 158, 156 each comprise a discrete-time sequence string and are configured to operate an RF amplifier by being combined at an input 162 of the amplifier 164 before amplification. For example, an adder 160 is illustrated for combining the RF burst 158 and 156 before amplification, however, any combiner, such as a multiplexer can be embodied. Alternatively, the combination can occur without any adder or combiner 160 when one of the pathways is grounded to zero while an alternate pathway is not.

In one embodiment, the discrete-time sequence string of the RF bursts 158, 156 comprise ternary sequences having three different amplitude levels. Consequently, the bursts do not have to be multiplied by a carrier frequency ($\omega_c$) and can drive switched amplifiers without modification. Additionally, the pulse-width modulated time signals 136, 138 can be used to send a corresponding carrier (zero and/or a phase-shifted carrier) to the RF amplifier (not shown) as a function of amplitude. After amplification by the efficient switched amplifier (e.g., class D), the desired amplitude-modulated and phase-modulated signal (complex baseband shifted up to the RF carrier) can then be reconstructed from the RF bursts by an appropriate bandpass filter before it is broadcast via an antenna (not shown).

Figure 2:
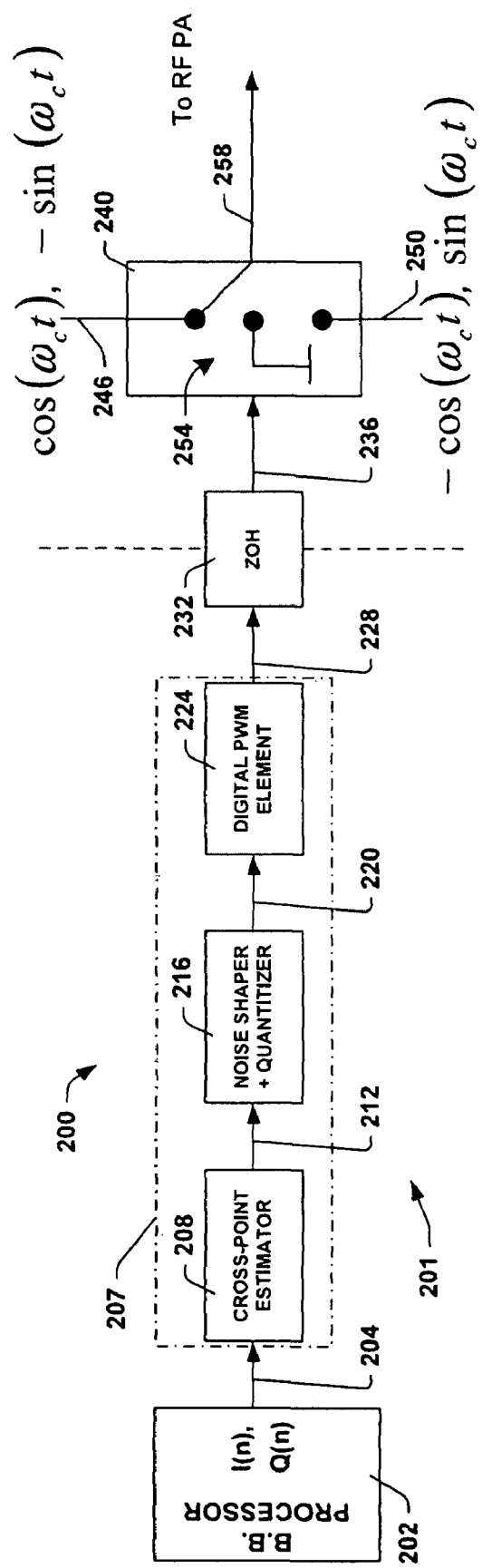
FIG. 2 is a simplified block diagram of a baseband modulator for a switched amplifier according to one embodiment.

Turning now to FIG. 2, illustrates an embodiment of modulation system 200 comprising a modulator 207 for receiving a component (I(n), Q(n)) of a complex baseband signal generated from a baseband processor 202. The modulator 207 can also comprise an embodiment of the pulse width modulators 107 and 109 of FIG. 1 for each pathway 101 and 103 of a corresponding amplitude signal, for example a baseband component. The modulator 207 can be configured to convert amplitude signals to a signal comprising at least two levels wherein the information of the amplitudes is in a timing. The modulator 207 further illustrates one example of an arrangement therein and can comprise various arrangements that are different from the one illustrated as one of ordinary skill in the art would appreciate.

In one embodiment, the modulator 207 is located in a pathway 201 and comprises a cross-point estimator 208 coupled to the baseband processor 202. Alternatively, the cross-point estimator can be located downstream and not coupled to the baseband processor. In one example, the cross-point estimator can be configured to receive a component 204 of a baseband signal as an input and compare the input to a reference signal (e.g., a triangular or saw-tooth waveform). The cross-point estimator 208 estimates where the reference signal and input signal component cross, and thereby determines where the output is changed. In the case of discrete time pulse width modulation, nonlinear interference can occur in the desired baseband because the pulse width is determined by a corresponding amplitude of an input sample and not by the cross point of the associated continuous-time input signal and the reference signal. To minimize this nonlinear interference, the scan (e.g., sample) values of the input signal components (I(n), Q(n)) can be recalculated in the cross-point estimator 208. Various methods for performing nonlinear calculations are commonly known by one of ordinary skill in the art, any of which can be performed herein, and are not discussed in detail within this disclosure.

In one embodiment, the modulator 207 can comprise a noise shaper and quantizer 216 that is configured to receive an input signal 212. The noise shaper and quantizer 216 can receive a component of the baseband signal (I(n), Q(n)) as the input signal 212. In one embodiment, the inputs signal can also be an output signal of the cross-point estimator 208. The noise shaper and quantizer 216 can also suppress noise components (e.g., nonlinear components) that can be formed during generation of RF burst 258 transmitted to a switched power amplifier (not shown), for example.

In one embodiment, the modulator 207 comprises a discrete time pulse width modulator element 224 that is configured to convert inputs signals 220 of a baseband signal into time signals suitable for driving and/or operating switched amplifiers. In other words, the discrete time pulse width modulator element 224 can code components of the baseband time signals (e.g., I(t)+jQ(t)) into corresponding time signals for operating switched power amplifiers. For example, the modulator 207 can generate at output 228 a proportionate number of pulses with amplitudes of 1 or −1 in correspondence with the amplitudes of the input samples. From these discrete-time pulse width modulated signals 228, a converter 232 is used to generate pulse width modulated time signals which can operate the switch 240. The switch 240 is configured to multiply a carrier (e.g., sin, cos) with a corresponding real component and/or imaginary component based on the position (240, 250, 254) of the switch 240 and generate a sequence of RF burst 258. In one embodiment, the discrete time sequence string of the RF bursts 258 comprise ternary sequences having three different amplitude levels. Consequently, the bursts do not have to be multiplied by a carrier frequency ($\omega_c$) and can drive switched amplifiers without modification. Additionally, the pulse width modulated signals 236 can be used to send a corresponding carrier (zero and/or a phase-shifted carrier) to the RF amplifier (not shown) as a function of amplitude. After amplification by the efficient switched amplifier (e.g., class D), the desired amplitude-modulated and phase-modulated signal (complex baseband shifted up to the RF carrier) can then be reconstructed from the RF bursts by an appropriate bandpass filter before it is broadcast via an antenna (not shown)

Figure 3:
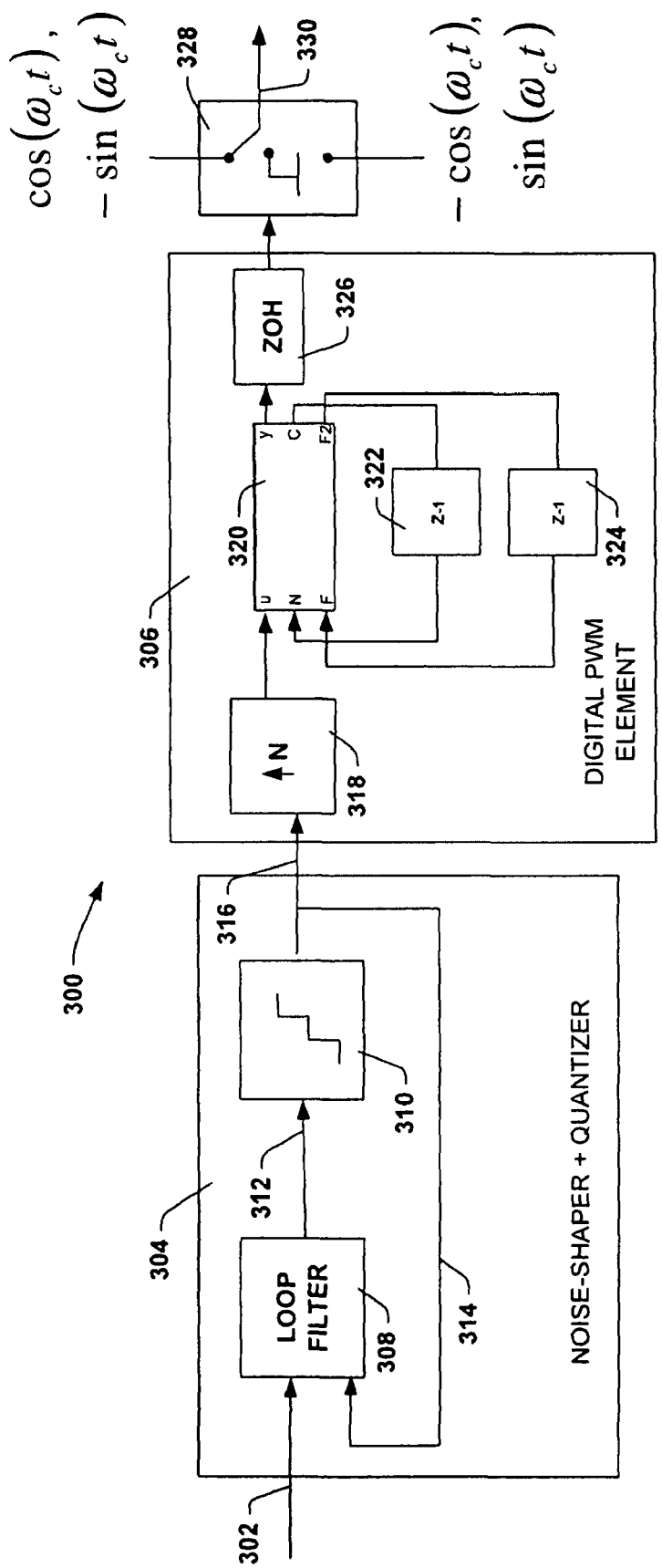
FIG. 3. is a simplified block diagram of a baseband modulator for a switched amplifier according to one embodiment.

Referring now to FIG. 3, illustrates one embodiment of a configuration of a component (I, Q) pathway 300 of a base band modulator comprising a noise-shaper and quantizer 304 coupled to a digital pulse width modulator element 306. Other configurations of the components may also be envisioned according to one of ordinary skill in the art. The component pathway 300 can be another example of pathways 107, 109 as illustrated in FIG. 1, and can calculate a component signal 302 respective of the component pathway 300 received with a predetermined offset. In one embodiment, the pathway can scale corresponding signal amplitudes to limit maximum duty cycles to a predetermined percent (e.g., less than 51 percent).

The noise shaper and quantizer 304 comprises noise shaping components that can receive the input signal 302 at a loop filter 308, which can represent the function of the noise shaping with a loop gain at the frequency of interest fp. After the input signal 302 is filtered and shaped by noise shaping a staircase block called a quantizer 310 can receive the signal 312. The quantizer 310 represents the quantization function that condenses the time resolution of the incoming signal from a continuous set of values to a discrete set of values (e.g., from amplitude values to pulse width values). Incidentally, condensation errors are produced therefrom, which are looped back in feedback path 314 to the loop filter 308 for being reduced in the frequency band of interest, and thus shaped out of the desired frequency band.

The output of the noise shaper and quantizer 304 is transmitted to a discrete time PWM element 306 for receiving pulse width values as an input sample 316. The discrete Time PWM element 306 comprises a sample rate converter 318, a duty cycle component 320, and a converter 326. The sample rate converter 318 increases the rate of the input 320 signal by a predetermined amount and allows the duty cycle component 320 to operate at a higher rate than otherwise. The duty cycle component 320 maps a duty cycle function to a discrete time signal. For example, the input signal magnitude (from the amplitudes of the input samples 316 from the noise shaper and quantizer) is assigned to a number of discrete pulses u. For example, if y is equal to 1 a positive pulse is generated and stored in the state F2 324 while a counter C 322 is incremented/decremented, for example. After the duty cycle component 320 maps a duty cycle function to a discrete time signal, the signal can be transmitted to a converter 326 (e.g., zero-order-hold converter) to convert a discrete-time pulse width modulated signal to a pulse width modulated time signal, which is then transmitted to a switch 328 in each respective path corresponding to a bandwidth component. The switch operates in a manner discussed above with the switches in FIGS. 1 and 2 for generating burst sequences by switched the pulse-width modulated time signals to a carrier signal in a frequency range for driving a power amplifier (not shown). In one embodiment, the corresponding pulse-width modulated time signals can comprise three different levels, and thus do not need to be multiplied by the carrier frequencies. They can be used to send the corresponding carrier (zero, or 180 degree phase-shifted carrier) to an RF amplifier (not shown) as a function of amplitude.

In one embodiment, the duty cycle component 320 calculates the discrete-time pulse width modulated signal with a predetermined time offset and scales respective amplitudes to limit maximum duty cycles. For example, maximum duty cycles may be limited to less than 51 percent. Consequently, the pulse width modulated time signals from corresponding component paths (I,Q) do not overlap one another and RF bursts can be obtained at the input to an RF amplifier for driving/operating the RF amplifier.

In one embodiment, burst sequences are generated by the switch 328 and are transmitted to a combiner (not shown), such as an adder or multiplexer. The combiner can be utilized for combining burst sequences of respective component pathways at an input 330 of the RF amplifier (e.g., switched amplifier). Alternatively, a combiner can be absent in the component pathway. This can be the case when one respective pathway is grounded while the other respective component pathway is being transmitted in accordance with the position of switch 328 operating as a function of amplitude, for example. The pathways can therefore alternate between corresponding bursts.

Figure 4:
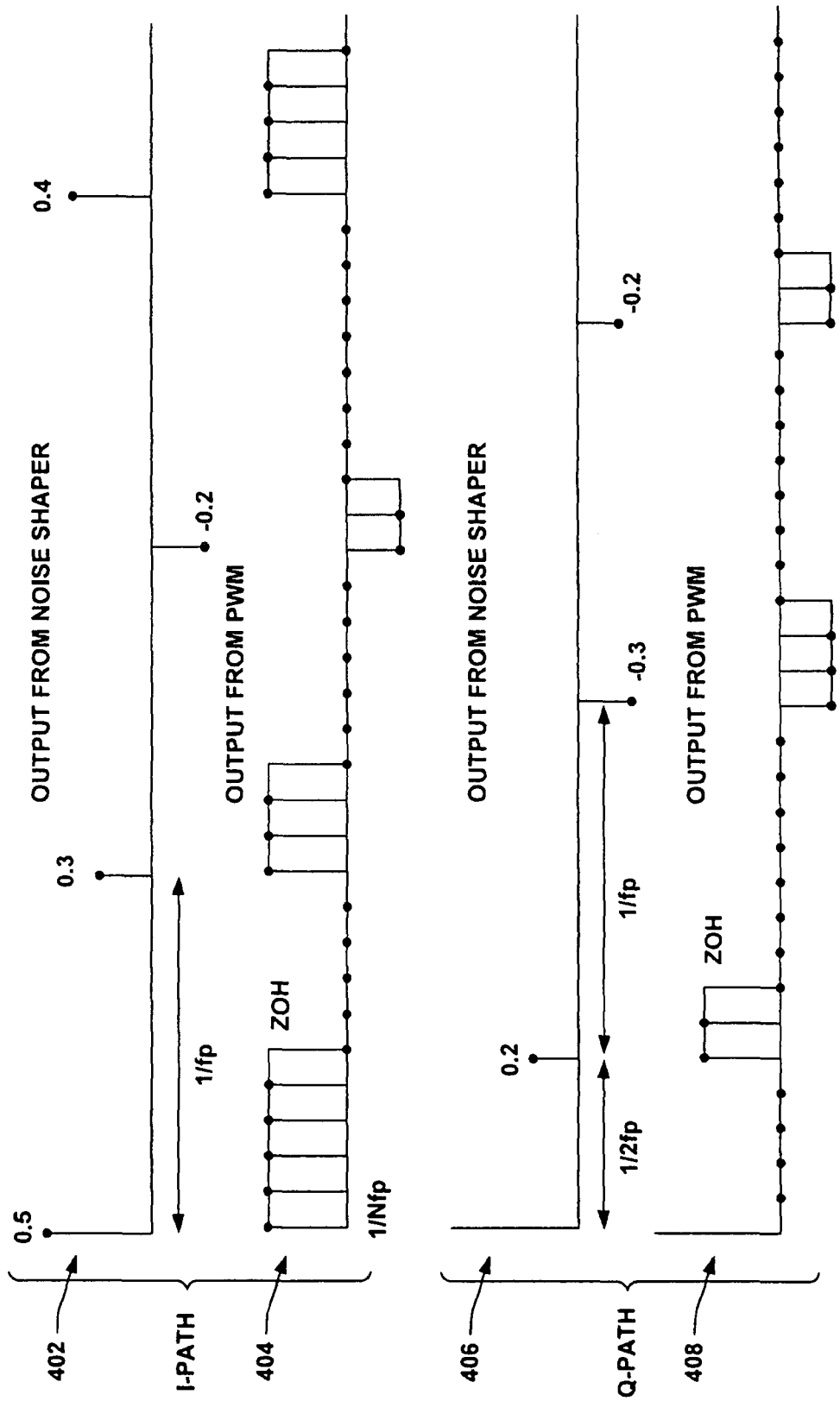
FIG. 4. is a plot of the output from a noise shaper and a pulse width modulator (PWM), in one embodiment.

FIG. 4 illustrates an example of non-overlapped signals from modulators (107, 109 of FIG. 1). Amplitude values (such as 0.5, 0.3, −0.2, and 0.4 for the I-path, and 0.2, −0.3, and −0.2 for the Q-path) are inputs to the noise shaper and quantizer 304 of FIG. 3. These values can be any values and are only used here for illustration purposes. For example, the values can be an infinite resolution in amplitude and can be any real number not just the values given as an example such as 0.5, 0.3, etc. In addition, the outputs paths 402 and 406 (first line for respective components) have discrete time signals with a distance of $1/Nf_p$, which is in terms of the modulational frequency $f_p$. After being quantized from the noise shaper and quantizer 304, the signals from the output to the noise shaper 402 and 406 can represent a finite number of different amplitudes, for example as shown in the output 402 and 406 of the noise shaper and quantizer 304 of FIG. 3 for an I-path and a Q-path respectively.

FIG. 4 further illustrates sample inputs and outputs that can be generated along an I or Q component pathway for a baseband signal. For example, the component pathway can be an in-phase component pathway and/or a quadrature component pathway in a plurality of pathways for a complex baseband signal. The pathway can also be any pathway for a signal comprising an amplitude signal and that converts that amplitude signal into at least two different signal levels for processing.

As the noise shaper and quantizer receives an input of amplitude values, the values are converted to pulse widths with a certain duty cycles as they move through the respective component pathway. The pulse widths can be proportional to the amplitude of the input samples, as illustrated in the second line of pulse width modulator (PWM) outputs 404 and 408 in FIG. 4, for example. In the case of a discrete time PWM, the values are discretized into a finite number of different amplitudes. For example, if the input amplitude value is in the range of −1 to +1, the amplitude can be divided into ten equal pulses. The quantizer quantizes the real input samples, for example, to put discrete samples to represent it. Therefore, an amplitude value of 0.5 at the input can correspond with five equal pulses in output 404, and so on with the other amplitude values for respective component paths as illustrated. Discrete-time pulse width modulated signals can thus be generated as a function of an amplitude signal. After being converted by a converter, such as a zero-order-hold device, the signals can be converted into an analog pulse width modulated signal, such as a pulse width modulated time signal, as represented in the output from the PWM of respective pathways, 404, 408. As illustrated the two pathways 404, and 408 are delayed with a predetermined duty cycle so they will not overlap one another and interfere.

Figure 5:
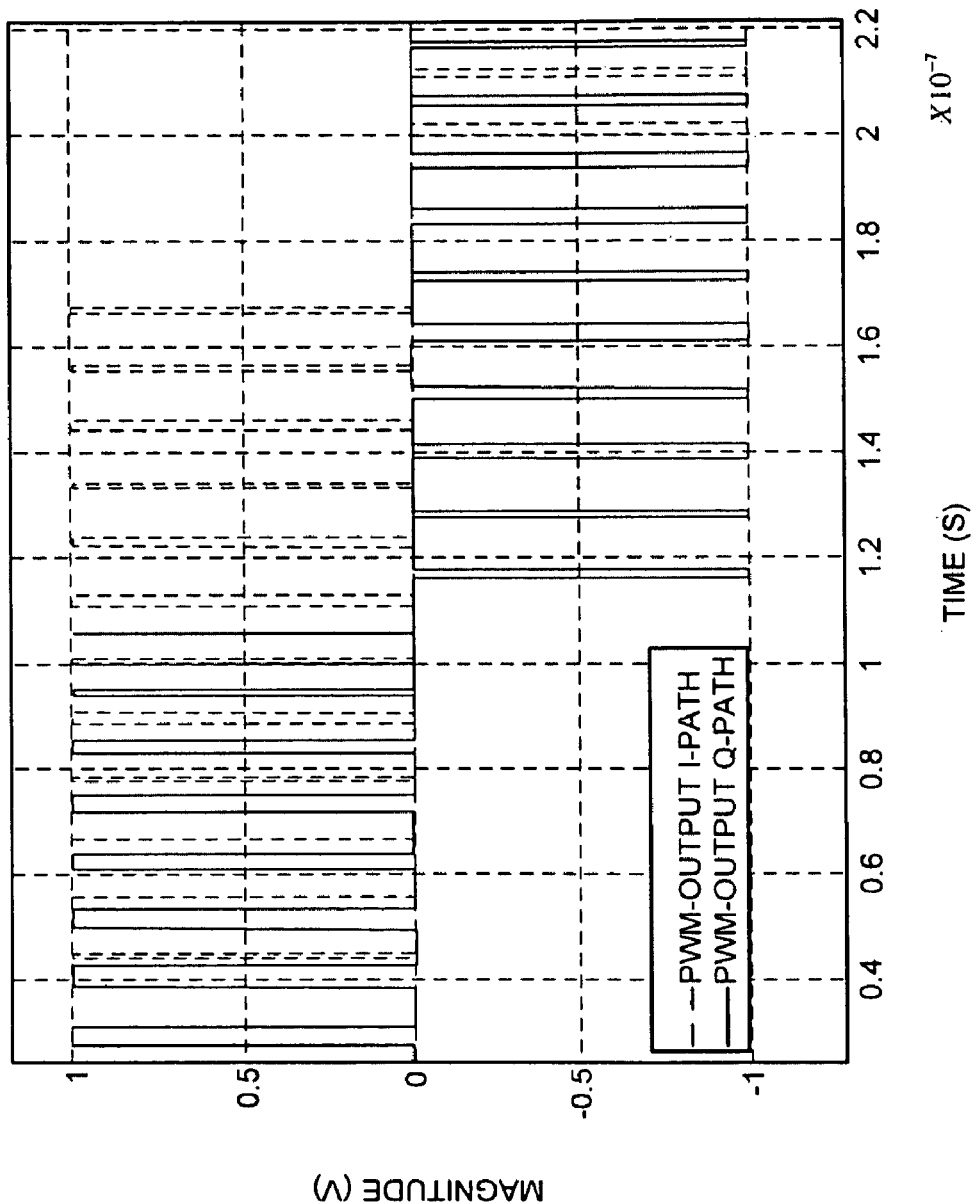
FIG. 5 is a plot of the baseband pulses signals of a pulse width modulator (PWM), in one embodiment.

FIG. 5 illustrates baseband pulse width modulated pulses for I component pathways and Q component pathways. Because the maximum pulse width is optimized and the two discrete-time signals in the I path and in the Q path are scanned with different phases, the signals can be combined after multiplication by the corresponding carrier signals without causing them to overlap.

Figure 6:
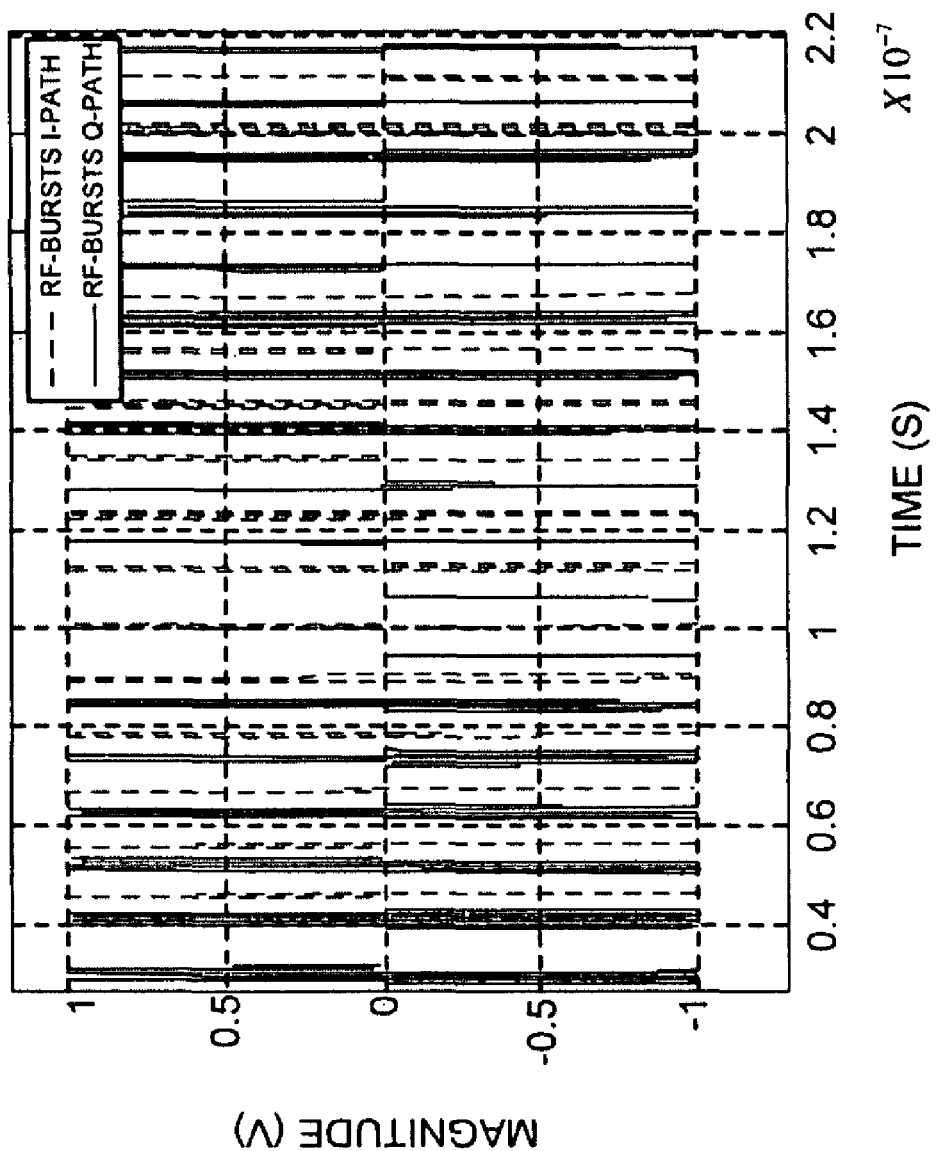
FIG. 6 is a plot of the baseband frequency signals of a pulse width modulator (PWM) such as may be used in the power amplifier, in one embodiment.

FIG. 6 illustrates bursts of RF sequences generated by a switch and that can be used to drive the operation of switched (e.g., Class D) amplifiers efficiently. Here the signal in FIG. 5 has been combined (e.g., multiplied) with a carrier, cosine or sine, or nothing. These are the two stages that a power amplifier can handle efficiently. As can be seen, the RF burst sequences from the I path and the RF burst sequences from the Q path do not substantially overlap, and thus are suitable for operating switched power amplifiers.

Figure 7:
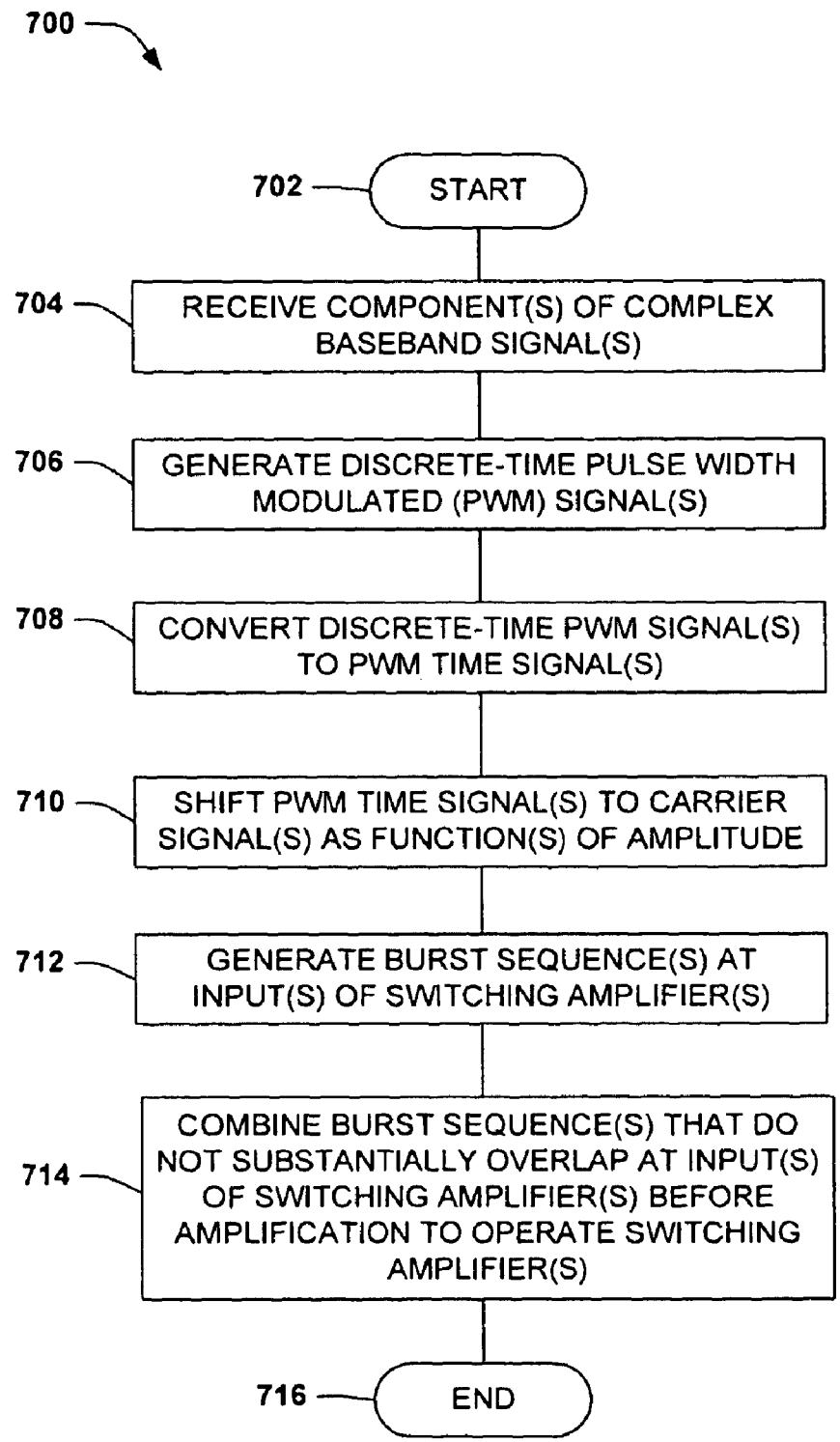
FIG. 7 is a method for modulating amplitude signal for switched amplifiers, in one embodiment.

Turning now to FIG. 7, is a method 700 for coding an amplitude signal into a modulated signal comprising at least two amplitude levels wherein the information of the amplitudes can be generated in the timing. The modulated signal can be converted into a continuous signal and generated into burst sequences configured to operate a switched power amplifier. For example, the continuous signal generated can be switched to a carrier corresponding to a component of a baseband signal as a function of amplitude. The bursts thereafter corresponding to the respective component can be combined an input of a switched amplifier to operate the amplifier.

In one embodiment, the method 700 is initialized at 702 and codes a respective component of a base band signal comprising an in-phase component and a quadrature component into a discrete-time sequence string in a baseband for a switched power amplifier. The method comprises receiving a component of the complex baseband signal 704. A corresponding component can be an amplitude signal that can be transmitted along respective component pathways for being generated into a signal of at least two amplitudes, such as a discrete-time pulse width modulated signal 706. The modulated signal (e.g., discrete-time pulse width modulated signals) can be converted to a pulse-width modulated time signal 708 wherein the information of the amplitudes are coded into the timing. At 710 the method 700 shifts the pulse-width modulated time signal to a carrier signal as a function of amplitude corresponding to the respective component and generates burst sequences 712 therefrom to input(s) of switched amplifier(s). The burst sequences of each component pathway can be combined 714 at the input(s) before amplification to operate the switched amplifier(s) and do not substantially overlap.

In one embodiment the burst sequences respectively comprise a ternary string of at least three different amplitude levels, and do not substantially overlap in time with one another, and the respective component comprises an in-phase component and a quadrature component of a complex baseband signal. The method can further comprise estimating a cross-point of a reference signal with the component of the baseband signal within the component pathway, and suppressing noise components therein by noise shaping to achieve a desired signal quality while generating a quantized output signal. In one embodiment, generating a discrete-time pulse width modulated signal from the component comprises calculating the component with a predetermined time offset, and scaling corresponding signal amplitudes to limit maximum duty cycles to a predetermined percent (e.g., less than 51 percent). The method finalizes at 716.

Although illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A baseband modulator configured to code a component of a complex baseband signal into a discrete-time sequence string in a baseband for a switched amplifier, comprising:
   a digital pulse width modulator configured to receive the component of the complex baseband signal and generate a discrete-time pulse width modulated signal;
   a converter coupled to the digital pulse width modulator and configured to receive the discrete-time pulse width modulated signal and generate a pulse-width modulated time signal; and
   a switch configured to shift the pulse-width modulated time signal to a radio frequency (RF) carrier signal corresponding to the component and generate burst sequences to an input of the switched amplifier to drive operation of the switched amplifier, wherein the digital pulse width modulator further comprises:
   a cross-point estimator determining an estimated cross-point of a reference signal with the baseband component of the baseband signal; and
   a noise shaper reducing quantization errors resulting from condensing of a time resolution and coupled to a quantization element generating a quantized output signal.

2. A baseband modulator configured to code a component of a complex baseband signal into a discrete-time sequence string in a baseband for a switched amplifier, comprising:
   a digital pulse width modulator configured to receive the component of the complex baseband signal and generate a discrete-time pulse width modulated signal;
   a converter coupled to the digital pulse width modulator and configured to receive the discrete-time pulse width modulated signal and generate a pulse-width modulated time signal; and
   a switch configured to shift the pulse-width modulated time signal to a radio frequency (RF) carrier signal corresponding to the component and generate burst sequences to an input of the switched amplifier to drive operation of the switched amplifier,
   wherein the digital pulse width modulator further comprises a digital pulse-width modulator element configured to calculate the discrete-time pulse width modulated signal with an appropriate time offset and configured to scale respective amplitudes to limit maximum duty cycles to less than fifty-one percent.

3. A baseband modulator configured to code amplitudes of a component signal into continuous time sequences for a switching amplifier, comprising:
   a plurality of modulating paths respectively corresponding to the component signal and configured to generate a modulated signal comprising at least two amplitude levels, respectively comprising:
      an input configured to receive the component signal;
      a modulator element configured to calculate the modulated signal with a predetermined time offset, and scale corresponding signal amplitudes to limit maximum duty cycles to a predetermined percent;
      an output of the modulating path configured to receive the modulated signal and to transmit a pulse width modulated continuous time sequence to a switch;
   wherein the switch is configured to switch the pulse width modulated continuous time sequence to a corresponding carrier as a function of amplitude and to generate burst sequences at an input of the switching amplifier;
   wherein the burst sequences from the plurality of modulating paths are combined at the input of the switching amplifier before amplification to operate the switching amplifier.

4. The modulator of claim 3, wherein the input of the amplifier is configured to receive the burst sequences that do not substantially overlap one another from the plurality of modulating paths for operation.

5. The modulator of claim 3, wherein the modulating paths further respectively comprise:
   a cross-point estimator determining an estimated cross-point of a reference signal with the component signal; and
   a noise shaper reducing quantization errors resulting from condensing of a time resolution and coupled to a quantization element generating a quantized output signal.

6. The modulator of claim 3, wherein the modulator element is configured to scale respective amplitudes to limit maximum duty cycles to less than fifty-one percent, and suppress noise components by a temporal discretization through a finite number of different pulse widths for the pulse width modulated continuous time signal.

7. The modulator of claim 3, wherein respective burst sequences comprise a ternary string of at lest three different amplitude levels and do not substantially overlap in time with one another.

8. A method for coding a respective component of a base band signal comprising an in-phase component and a quadrature component into a discrete-time sequence string in a baseband for a switching amplifier, the method comprising:
   receiving a component of the complex baseband signal;
   generating a discrete-time pulse width modulated signal from the component received;
   converting the discrete-time pulse width modulated signal to a pulse-width modulated time signal;
   shifting the pulse-width modulated time signal to a radio frequency (RF) carrier signal as a function of amplitude corresponding to a respective component pathway and generating burst sequences therefrom to an input of the switching amplifier;
   wherein the burst sequences corresponding to the respective component pathway are combined at an input of the switching amplifier before amplification to operate the switching amplifier and do not substantially overlap in time with one another;
   estimating a cross-point of a reference signal with the component of the complex baseband signal;
   suppressing noise components by noise shaping to achieve a desired signal quality; and
   generating a quantized output signal.

9. A method for coding a respective component of a base band signal comprising an in-phase component and a quadrature component into a discrete-time sequence string in a baseband for a switching amplifier, the method comprising:
   receiving a component of the complex baseband signal;
   generating a discrete-time pulse width modulated signal from the component received;
   converting the discrete-time pulse width modulated signal to a pulse-width modulated time signal;
   shifting the pulse-width modulated time signal to a radio frequency (RF) carrier signal as a function of amplitude corresponding to a respective component pathway and generating burst sequences therefrom to an input of the switching amplifier;

wherein the burst sequences corresponding to the respective component pathway are combined at an input of the switching amplifier before amplification to operate the switching amplifier and do not substantially overlap in time with one another, wherein generating a discrete-time pulse width modulated signal from the component comprises calculating the component with a predetermined time offset, and scaling corresponding signal amplitudes to limit maximum duty cycles to a predetermined percent.

* * * * *